(12) United States Patent
Nobori et al.

(10) Patent No.: US 11,277,571 B2
(45) Date of Patent: Mar. 15, 2022

(54) IMAGE GENERATION DEVICE AND IMAGE GENERATION METHOD

(71) Applicant: Panasonic Intellectual Property Management Co., Ltd., Osaka (JP)

(72) Inventors: Kunio Nobori, Osaka (JP); Satoshi Sato, Kyoto (JP); Takeo Azuma, Kyoto (JP); Nobuhiko Wakai, Tokyo (JP); Mitsuru Harada, Osaka (JP); Shinichi Machida, Osaka (JP); Masumi Izuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/136,722

(22) Filed: Dec. 29, 2020

(65) Prior Publication Data
US 2021/0120165 A1 Apr. 22, 2021

Related U.S. Application Data

(63) Continuation of application No. PCT/JP2019/033538, filed on Aug. 27, 2019.
(Continued)

(51) Int. Cl.
*H04N 5/235* (2006.01)
*H01L 27/30* (2006.01)

(52) U.S. Cl.
CPC ......... *H04N 5/2358* (2013.01); *H01L 27/307* (2013.01)

(58) Field of Classification Search
CPC .................................................. H04N 5/2358
(Continued)

(56) References Cited

U.S. PATENT DOCUMENTS

2016/0119562 A1* 4/2016 Takase ................... H04N 5/378
348/230.1
2018/0184052 A1* 6/2018 Sato .................. H04N 9/04551
(Continued)

FOREIGN PATENT DOCUMENTS

JP 2008-227092 9/2008
JP 2018-125495 8/2018
(Continued)

OTHER PUBLICATIONS

International Search Report (ISR) dated Oct. 15, 2019 in International (PCT) Application No. PCT/JP2019/033538.
(Continued)

*Primary Examiner* — Joel W Fosselman
(74) *Attorney, Agent, or Firm* — Wenderoth, Lind & Ponack, L.L.P.

(57) ABSTRACT

An image generation device includes: a voltage generator that generates a plurality of voltages each having a different voltage value; an image capturer that includes an organic photoconductive film, and performs imaging every time each of the plurality of voltages is applied; a luminance data obtainer that obtains a plurality of luminance data items corresponding to the plurality of voltages applied, each of the plurality of luminance data items being obtained from the imaging performed by the image capturer; and a color image generator that generates a color image based on the plurality of luminance data items.

11 Claims, 10 Drawing Sheets

Related U.S. Application Data (60) Provisional application No. 62/724,796, filed on Aug. 30, 2018.

(58) Field of Classification Search
USPC .................................................. 348/207.99
See application file for complete search history.

(56) References Cited

U.S. PATENT DOCUMENTS

| | | | |
|---|---|---|---|
| 2018/0227490 A1 | 8/2018 | Nakata et al. | |
| 2019/0245009 A1 | 8/2019 | Lee et al. | |

FOREIGN PATENT DOCUMENTS

| | | |
|---|---|---|
| JP | 2018-125839 | 8/2018 |
| JP | 2019-140677 | 8/2019 |

OTHER PUBLICATIONS

Shin'ichi Machida, et al., "A 2.1-Mpixel Organic Film-Stacked RGB-IR Image Sensor With Electrically Controllable IR Sensitivity", IEEE Journal of Solid-State Circuits, vol. 53, No. 1, Jan. 2018, pp. 229-235.

Extended European Search Report dated Aug. 24, 2021 in corresponding European Patent Application No. 19854631.9.

Sakai T et al: "Color Image Sensor with Organic Photoconductive Films", 2015 IEEE International Electron Devices Meeting (IEDM), IEEE, Dec. 2015.

Machida Shin'ichi et al: "4.7 A 2.1Mpixel Organic-Film Stacked RGB-IR Image Sensor with Electrically Controllable IR Sensitivity", 2017 IEEE International Solid-State Circuits Conference (ISSCC), IEEE, Feb. 2017, pp. 78-79.

Shishido Sanshiro et al: "6.2 210ke- Saturation Signal 3μm-Pixel Variable-Sensitivity Global-Shutter Organic Photoconductive Image Sensor for Motion Capture", 2016 IEEE International Solid-State Circuits Conference (ISSCC), IEEE, Jan. 2016, pp. 112-113.

* cited by examiner

COLOR IMAGE Dc

LUMINANCE DATA

D1    D2    D3

IMAGING AT VOLTAGE V1

IMAGING AT VOLTAGE V2

IMAGING AT VOLTAGE V3

SAME OBJECT Ob1

IMAGE GENERATION DEVICE AND IMAGE GENERATION METHOD

CROSS REFERENCE TO RELATED APPLICATIONS

This application is a U.S. continuation application of PCT International Patent Application Number PCT/JP2019/033538 filed on Aug. 27, 2019, claiming the benefit of priority of U.S. Provisional Patent Application No. 62/724,796 filed on Aug. 30, 2018, the entire contents of which are hereby incorporated by reference.

BACKGROUND

1. Technical Field

The present disclosure relates to an image generation device that includes an imaging element having an organic photoconductive film (OPF), and to an image generation method.

2. Description of the Related Art

Image generation devices that include an imaging element with multiple pixels have been known. As an example of this type of image generation devices, non-patent literature (NPL) 1: Shinichi Machida, Sanshiro Shishido, Takeyoshi Tokuhara, Masaaki Yanagida, Takayoshi Yamada, Masumi Izuchi, Yoshiaki Sato, Yasuo Miyake, Manabu Nakata, Masashi Murakami, Mitsuru Harada, and Yasunori Inoue, "A 2.1-Mpixel Organic Film-Stacked RGB-IR Image Sensor With Electrically Controllable IR Sensitivity", IEEE JOURNAL OF SOLID-STATE CIRCUIT, vol. 53, NO. 1, pp. 229-235, JANUARY 2013, describes an image generation device that includes a color filter and an imaging element. In this image generation device, each pixel in the imaging element includes four subpixels. The color filter in this image generation device splits incident light into R (red), G (green), B (blue), and IR (infrared) components, each of which is then photoelectrically converted in corresponding subpixels. Image processing is then performed to generate a color image.

SUMMARY

In the image generation device in non-patent literature 1, however, the use of the color filter necessitates each pixel to include four subpixels of R, G, B, and IR. This increases the area per pixel, posing the problem of a decreased resolution of color images.

A nonlimiting exemplary aspect of the present disclosure is an image generation device capable of increasing the resolution of color images. Another nonlimiting exemplary aspect of the present disclosure is an image generation method capable of increasing the resolution of color images. Additional benefits and advantages of aspects of the present disclosure will become apparent from this specification and the drawings. These benefits and/or advantages may be individually provided by various aspects and features disclosed in this specification and the drawings, and not all the aspects and features are necessary for achieving one or more of the benefits and advantages.

An image generation device according to an aspect of the present disclosure includes: a voltage generator that generates a plurality of voltages each having a different voltage value; an image captures that includes an organic photoconductive film, and performs imaging every time each of the plurality of voltages is applied; a luminance data obtainer that obtains a plurality of luminance data items corresponding to the plurality of voltages applied, each of the plurality of luminance data items being obtained from the imaging performed by the image capturer; and a color image generator that generates a color image based on the plurality of luminance data items.

Moreover, an image generation method according to an aspect of the present disclosure includes: performing imaging by applying, to an organic photoconductive film, a plurality of voltages each having a different voltage value; obtaining a plurality of luminance data items corresponding to the plurality of voltages applied, the plurality of luminance data items being obtained from the imaging; and generating a color image based on the plurality of luminance data items.

The above-described general or specific aspects may be implemented using a system, a method, a computer program, or a computer-readable recording medium, or may be implemented using a combination of a device, a system, a method, a computer program, and a computer-readable recording medium. The computer-readable recording medium may be a nonvolatile recording medium such as, for example, a CD-ROM (Compact Disc-Read Only Memory).

According to the present disclosure, the resolution of color images can be increased.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Underlying Knowledge of Present Disclosure)

In conventional image generation devices that use a color filter, each pixel needs to include four subpixels of R, G, B, and IR. This increases the area per pixel, posing the problem of a decreased resolution of color images. In order to solve this problem, a device is proposed that generates a color image of an object without using a color filter for imaging the object. If an object can be imaged without using a color filter, the area per pixel can replace the area per subpixel of the conventional art to reduce the area per pixel. Consequently, the resolution of color images can be increased.

Figure 1:
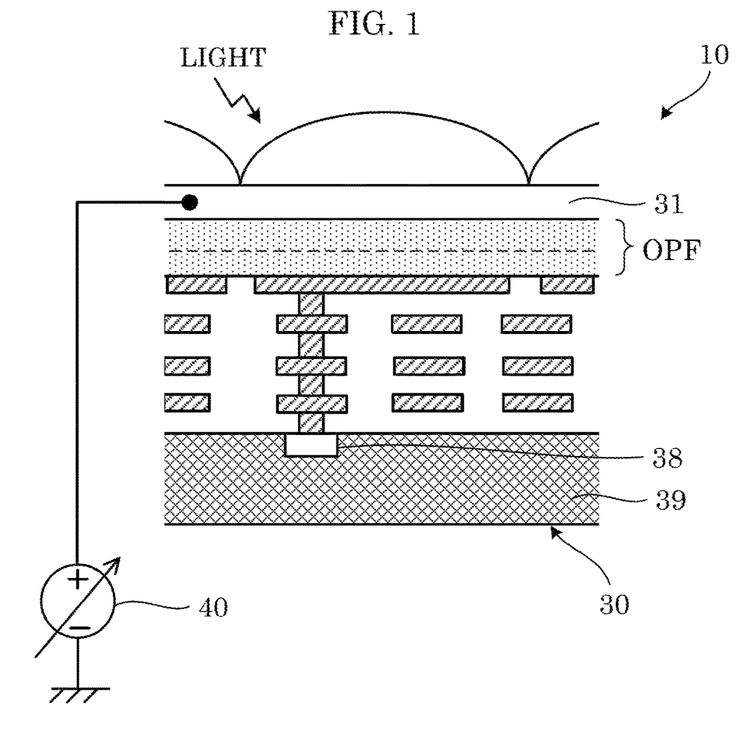
FIG. 1 is a schematic diagram showing an image capturer and a voltage generator in an image generation device.

FIG. 1 is a schematic diagram showing image capturer 10 and voltage generator 40 in an image generation device.

Image capturer 10 includes imaging element 30 having multiple pixels. Imaging element 30 includes: FDs (floating diffusions) 38 provided on silicon substrate 39; metal wires and pixel electrodes electrically connected to FDs 38; organic photoconductive film OPF provided on the pixel electrodes; and transparent electrode 31 provided on organic photoconductive film OPF.

Organic photoconductive film OPF is a light guide film that photoelectrically converts light entering through transparent electrode 31. Organic photoconductive film OPF has a stacked structure including a layer for detecting visible light and a layer for detecting near-infrared light. Electric charge resulting from photoelectric conversion by organic photoconductive film OPF is stored in FDs 38.

Voltage generator 40 for applying voltage to organic photoconductive film OPF via transparent electrode 31 is connected to image capturer 10.

Figure 2:
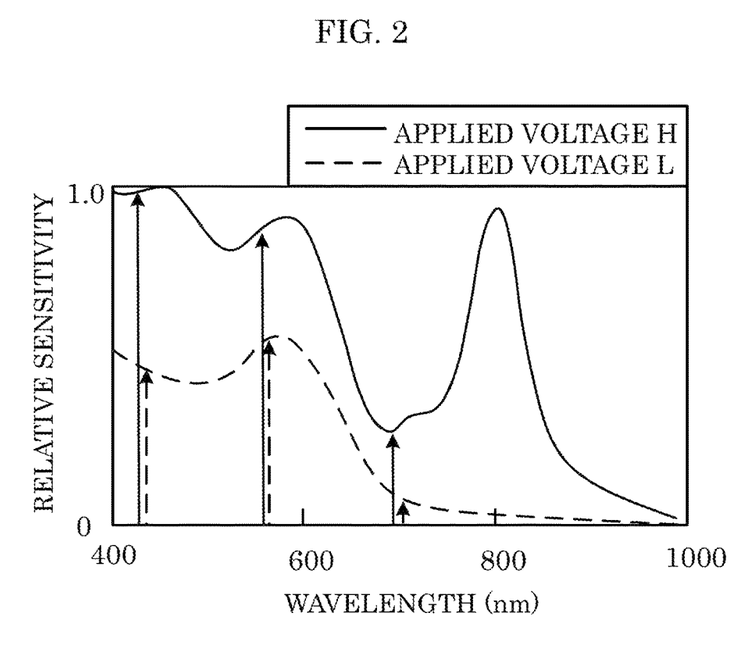
FIG. 2 is a schematic diagram showing an example of wavelength-sensitivity characteristics of an imaging element having an organic photoconductive film.

FIG. 2 is a schematic diagram showing an example of wavelength-sensitivity characteristics of imaging element 30 having organic photoconductive film OPF.

As shown, imaging element 30 exhibits different sensitivity characteristic tendencies for each of voltages H and L (L<H) applied to organic photoconductive film OPF. Specifically between the applied voltages H and L, the sensitivity for blue, green, and red wavelengths appears to differ not by a fixed factor but by a variable factor.

Thus, the sensitivity characteristic of imaging element 30 having organic photoconductive film OPF depends on the voltage applied to organic photoconductive film OPF. As such, the present disclosure proposes a device in which different sensitivity characteristics (filter characteristics) are created by varying the voltage applied to an organic photoconductive film, and based on data obtained from these sensitivity characteristics, a color image is generated. An image generation device and other features of the present disclosure will be described below.

An image generation device according to an aspect of the present disclosure includes: a voltage generator that generates a plurality of voltages each having a different voltage value; an image capturer that includes an organic photoconductive film, and performs imaging every time each of the plurality of voltages is applied; a luminance data obtainer that obtains a plurality of luminance data items corresponding to the plurality of voltages applied, each of the plurality of luminance data items being obtained from the imaging performed by the image capturer; and a color image generator that generates a color image based on the plurality of luminance data items.

As above, multiple sensitivity characteristics can be created by applying multiple voltages to the organic photoconductive film. Based on multiple luminance data items obtained from these sensitivity characteristics, a color image can be generated. Consequently, the color image can be generated without using a color filter and therefore with a small area per pixel. This can increase the resolution of the color image.

Moreover, the color image generator may generate the color image by multiplying the plurality of luminance data items by a set of coefficients that is predetermined.

In the above manner, a color image can be generated in a simple manner based on the multiple luminance data items. According to the image generation device of the present disclosure, the resolution of the color image generated in the above simple manner can be increased.

Moreover, the set of coefficients may be derived by: imaging a color chart having a plurality of colors using the image capturer to obtain a determinant including color data corresponding to the plurality of colors, the set of coefficients, and the plurality of luminance data items; and solving the determinant using a pseudo inverse matrix.

In the above manner, a closely reproduced color image can be generated based on the multiple luminance data items. According to the image generation device of the present disclosure, the resolution of the closely reproduced color image generated as above can be increased.

Moreover, the set of coefficients may be derived by: imaging a color chart having a plurality of colors using the image capturer; and performing learning using, as input data, the plurality of luminance data items obtained from the imaging of the color chart, and as label data, color data corresponding to the plurality of colors.

In the above manner, a closely reproduced color image can be generated based on the multiple luminance data items. According to the image generation device of the present disclosure, the resolution of the closely reproduced color image generated as above can be increased.

Moreover, the voltage generator may change at least one of the plurality of voltages in accordance with a scene in which the imaging is performed by the image capturer.

As above, imaging for various purposes is possible by changing the voltage according to the scene in which the imaging is performed. According to the image generation device of the present disclosure, the resolution of color images generated by imaging for various purposes can be increased.

Moreover, the voltage generator may modulate at least one of the plurality of voltages during exposure by the image capturer.

As above, modulating the voltage during exposure enables a sensitivity characteristic for a specific purpose to be created and then used to generate a color image. According to the image generation device of the present disclosure, the resolution of color images generated by imaging for various purposes can be increased.

Moreover, the image capturer includes a plurality of organic photoconductive films that are stacked, each of the plurality of organic photoconductive films being the organic photoconductive film, and a total number of the plurality of voltages to be applied to the plurality of organic photoconductive films may be greater than or equal to a total number of the plurality of organic photoconductive films.

In the above manner, more sensitivity characteristics can be created. This enables a closely reproduced color image to be generated using further accurate sensitivity characteristics.

Moreover, the image capturer includes, as the plurality of organic photoconductive films, a first organic photoconductive film for detecting visible light and a second organic photoconductive film for detecting near-infrared light, and the first organic photoconductive film may be disposed closer to an object than the second organic photoconductive film is.

In the above manner, the first organic photoconductive film can detect near-infrared light after the second organic photoconductive film detects and eliminates visible light. This can improve near-infrared light detection performance.

Moreover, the image capturer includes, as the plurality of organic photoconductive films, a first organic photoconductive film for detecting visible light and a second organic photoconductive film for detecting near-infrared light, and the second organic photoconductive film may be disposed closer to an object than the first organic photoconductive film is.

In the above manner, the second organic photoconductive film can detect visible light after the first organic photoconductive film detects and eliminates near-infrared light. This can improve color reproducibility for visible light.

Moreover, an image generation method according to an aspect of the present disclosure includes: performing imaging by applying, to an organic photoconductive film, a plurality of voltages each having a different voltage value; obtaining a plurality of luminance data items corresponding to the plurality of voltages applied, the plurality of luminance data items being obtained from the imaging; and generating a color image based on the plurality of luminance data items.

As above, multiple sensitivity characteristics can be created by applying multiple voltages to the organic photoconductive film. Based on multiple luminance data items obtained from these sensitivity characteristics, a color image can be generated. Consequently, the color image can be generated without using a color filter and therefore with a small area per pixel. This can increase the resolution of the color image.

These general or specific aspects include one or more combinations of a device, a system, a method, an integrated circuit, a computer program, and a computer-readable recording medium.

Embodiments will be described in detail below with reference to the drawings. Any of the embodiments to be described below illustrates an example of the present disclosure. Values, shapes, materials, elements, arrangements and connections of elements, steps, and the order of steps illustrated in the following embodiments are exemplary and not intended to limit the present disclosure. Among the elements in the following embodiments, those not set forth in the independent claims representing implementations according to aspects of the present disclosure will be described as optional elements. Implementations of the present disclosure are not limited to the current independent claims but may also be represented by other independent claims.

The drawings are schematic views and not necessarily drawn to scale. Throughout the drawings, substantially like components are given like symbols, and redundant description thereof may be omitted or simplified.

Embodiment 1

1-1. Configurations and Operations of Image Generation Device

Configurations of an image generation device in embodiment 1 will be described with reference to FIGS. 3 to 6.

Figure 3:
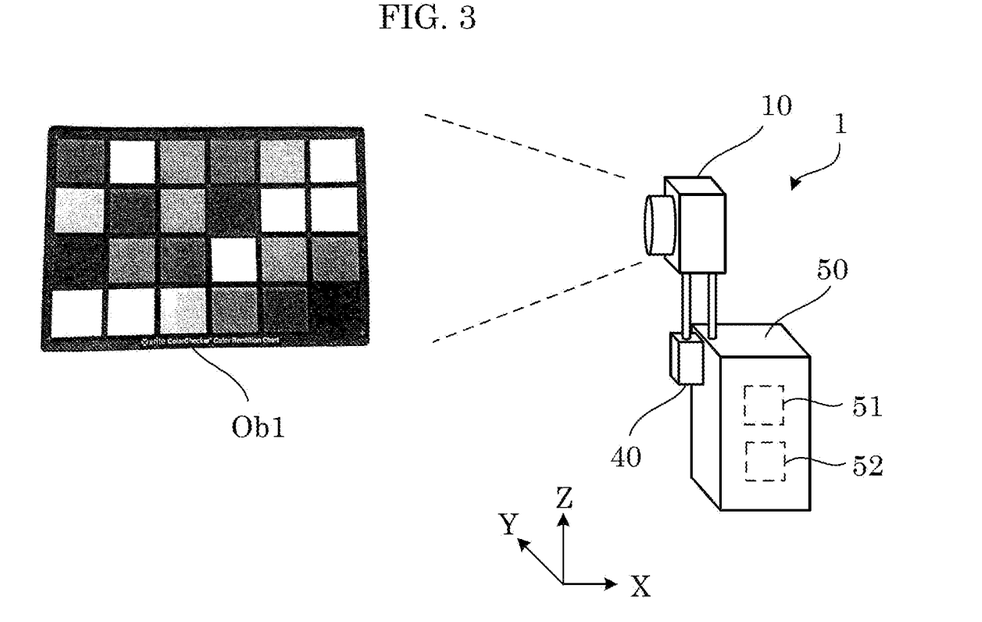
FIG. 3 is a schematic diagram showing an image generation device in embodiment 1.
Figure 4:
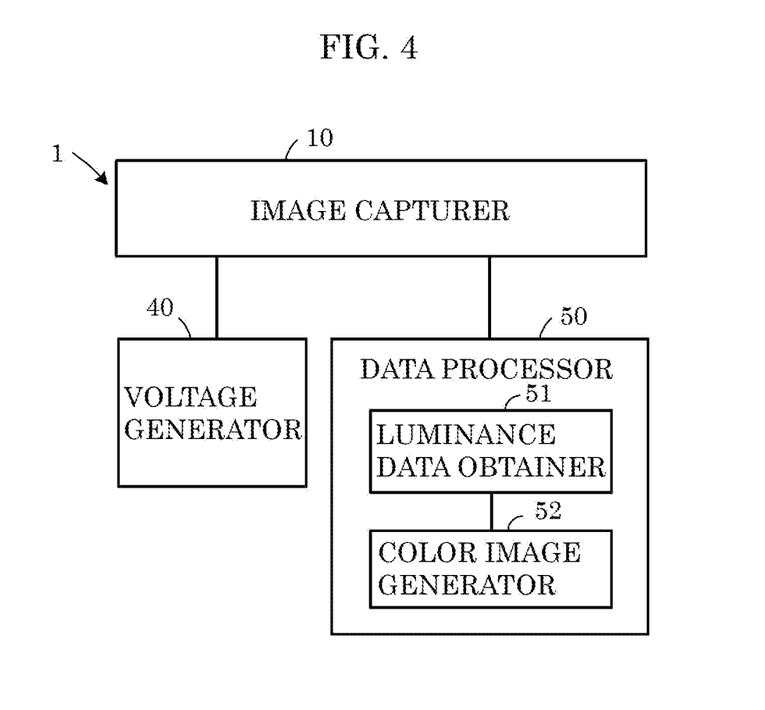
FIG. 4 is a block diagram showing a configuration of the image generation device in embodiment 1.

FIG. 3 is a schematic diagram showing image generation device 1 in embodiment 1. FIG. 4 is a block diagram showing a configuration of image generation device 1.

As shown in FIGS. 3 and 4, image generation device 1 includes: image captures 10 that images an object Ob1; voltage generator 40 that generates voltages to be applied to image capturer 10; and data processor 50 that processes an imaging result obtained by image capturer 10.

Data processor 50 includes: luminance data obtainer 51 that obtains luminance data from the imaging result obtained by image capturer 10; and color image generator 52 that generates a color image based on the luminance data.

In FIGS. 3 and 4, voltage generator 40 is separate from data processor 50 and image capturer 10. Alternatively voltage generator 40 may be provided in the housing containing data processor 50 or in the housing containing image capturer 10.

This embodiment may also be implemented as an image generation system that includes: a signal generation device having image capturer 10 and voltage generator 40: and a data processing device corresponding to data processor 50. In this case, the signal generation device and the data processing device each have a communicator. The signal generation device transmits digital signals (to be described below) to the data processing device through wired or wireless communication.

Figure 5:
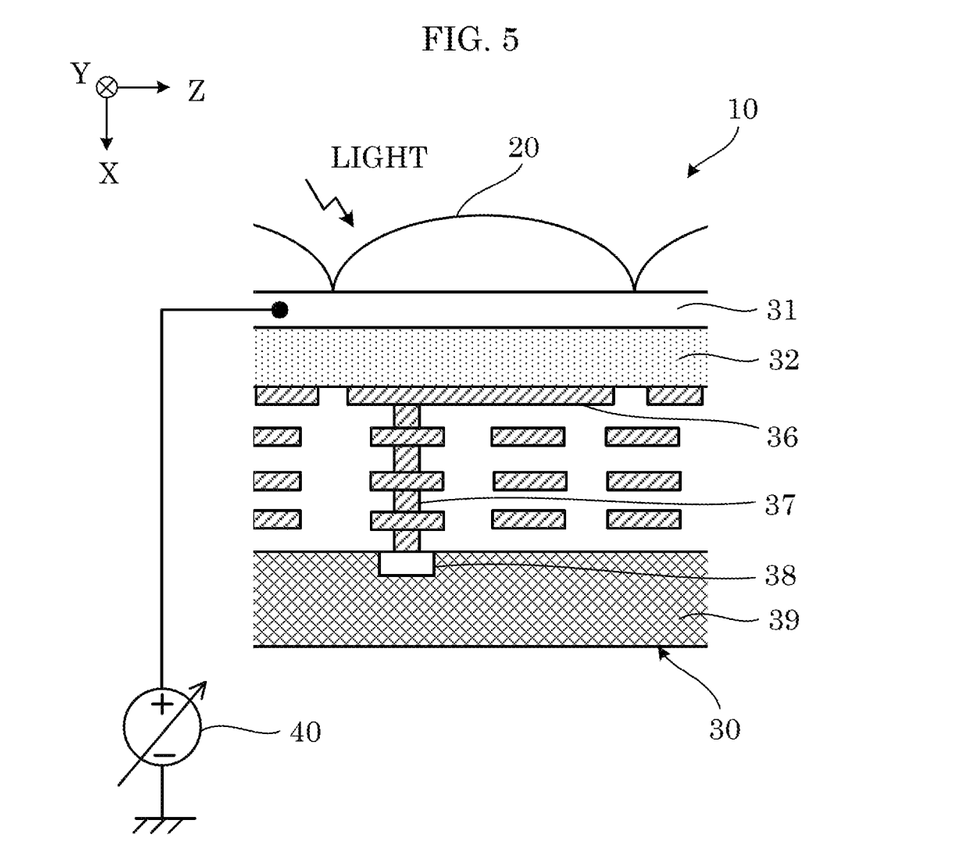
FIG. 5 is a schematic diagram showing an image capturer and a voltage generator in the image generation device in embodiment 1.

FIG. 5 is a schematic diagram showing image capturer 10 and voltage generator 40 in image generation device 1.

Image capturer 10 includes: microlenses 20; and imaging element 30 having pixels arranged in an array. In this embodiment, no color filter is provided between microlenses 20 and imaging element 30.

Microlenses 20 are arranged in an array in correspondence with the respective pixels. Each microlens 20 gathers incident light and directs the light toward the corresponding pixel in imaging element 30.

Imaging element 30 is an element that receives light gathered by microlenses 20 and outputs electric signals. Imaging element 30 includes: silicon substrate 39; FDs 38 provided on silicon substrate 39; metal wires 37 and pixel electrodes 36 electrically connected to FDs 38; organic photoconductive film 32 provided on pixel electrodes 36; and transparent electrode 31 provided on organic photoconductive film 32.

Transparent electrode 31 is a light-transmissive electrode and is formed of a transparent material such as ITO (Indium Tin Oxide) or ZnO. Transparent electrode 31 is disposed between microlenses 20 and organic photoconductive film 32, and connected to voltage generator 40 via, e.g., wiring.

Organic photoconductive film 32 is a light guide film that photoelectrically converts light entering through microlenses 20 and transparent electrode 31. As described above, imaging element 30 having organic photoconductive film 32 has a characteristic such that the light sensitivity depends on the value of voltage applied to organic photoconductive film 32. Although organic photoconductive film 32 shown in FIG. 5 is single-layered, this is not restrictive. Rather, organic photoconductive film 32 may include multiple layers, such as a layer for detecting the R component, a layer for detecting the G component, and a layer for detecting the B component. Organic photoconductive film 32 is connected to FDs 38 via pixel electrodes 36 and metal wires 37.

Each FD 38 is a charge storage node that stores electric charge resulting from photoelectric conversion performed by organic photoconductive film 32. Imaging element 30 has multiple FDs 38, which are disposed in one-to-one correspondence with the pixels. FDs 38 store the electric charge during imaging, i.e., exposure, performed by image capturer 10.

Voltage generator 40 is a voltage generation device that generates multiple voltages of different voltage values. For example, voltage generator 40 has multiple transistors and generates multiple voltages by turning on and off the transistors. Voltage generator 40 has its positive side connected to transparent electrode 31, and its negative side grounded. Voltage generator 40 applies the voltages to organic photoconductive film 32 via transparent electrode 31.

Figure 6:
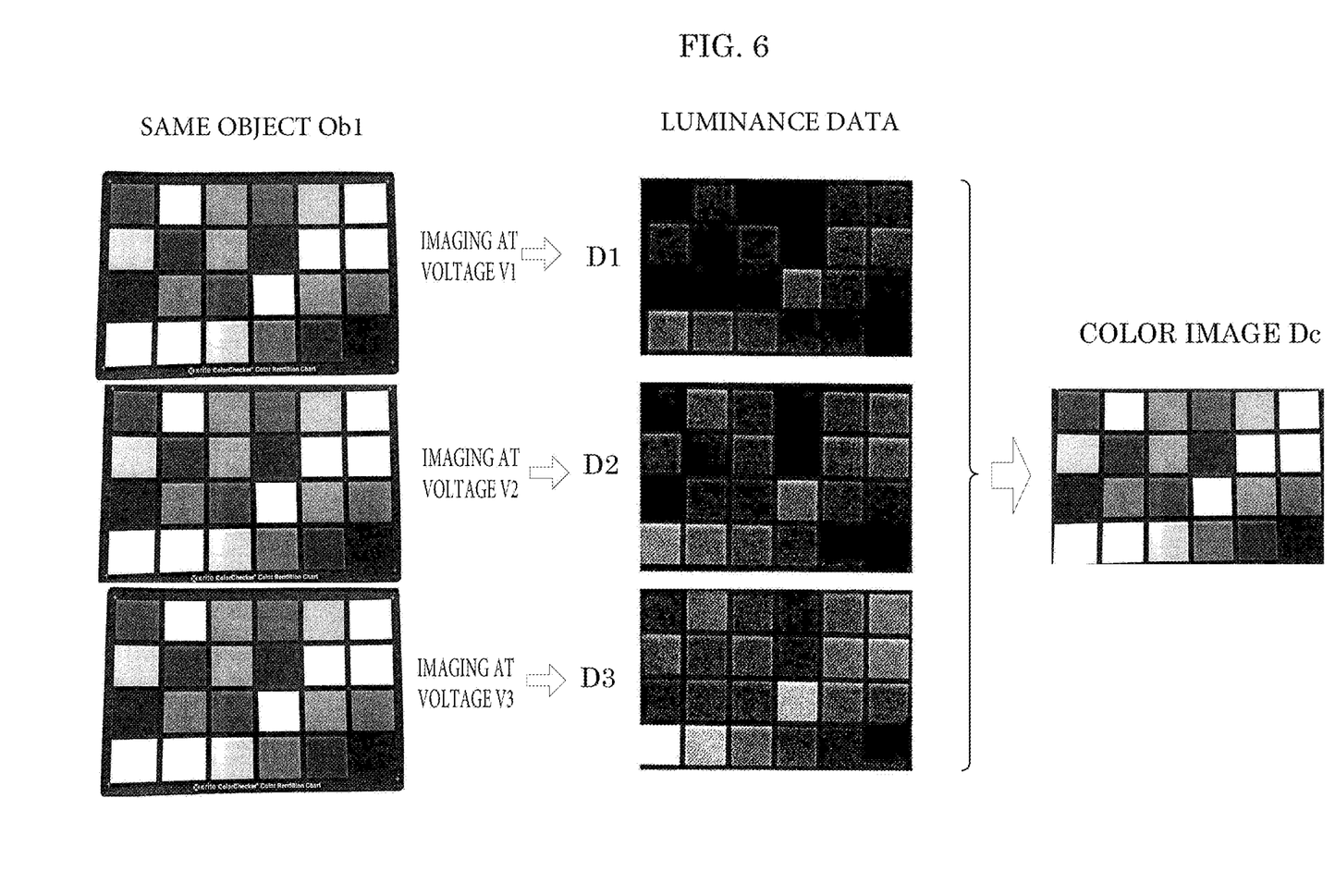
FIG. 6 is a diagram showing an example of data obtained by the image generation device in embodiment 1.

FIG. 6 is a diagram showing an example of data obtained by image generation device 1.

In this embodiment, the object Ob1 is imaged while voltage generator 40 is used to vary the voltage applied to organic photoconductive film 32. For example, in image generation device 1, three voltages V1, V2, and V3 are sequentially applied to organic photoconductive film 32 to create three different sensitivity characteristics. Image capturer 10 performs imaging when each of the three voltages V1 to V3 is applied.

Electric charge obtained by organic photoconductive film 32 having the three characteristics is stored in FDs 38 for each imaging time. Image capturer 10 detects potentials resulting from the electric charge stored in FDs 38 and converts the potentials into digital signals, which are output to data processor 50. Voltage generator 40 may transmit information on the voltages applied (the magnitudes of the voltages applied, and the application times) to data processor 50.

Luminance data obtainer 51 obtains luminance data based on the digital signals output from image capturer 10. Specifically as shown in FIG. 6, luminance data obtainer 51 obtains luminance data D1, D2, and D3 corresponding to the respective voltages V1 to V3 applied by image capturer 10 in imaging the object Ob1.

Color image generator 52 generates a color image Dc based on the luminance data D1 to D3. Specifically color image generator 52 multiplies the luminance data D1 to D3 by a predetermined set of coefficients A1 (see Formula (2)) and performs data processing, thereby generating the color image Dc. It is to be noted that color image generator 52 may generate the color image Dc using information on the voltages actually applied, or using information on the predetermined voltages to be applied. That is, the color image Dc may be generated using a set of coefficients corresponding to the voltage values. Color image generator 52 outputs the generated color image Dc as a digital signal or an analog signal to the outside of image generation device 1 via, e.g., a video output terminal (not shown).

1-2. Image Generation Method

Now, an image generation method in this embodiment will be described with reference to FIG. 7. The description here is mainly directed to an example in which three voltages V1 to V3 are applied to organic photoconductive film 32.

Figure 7:
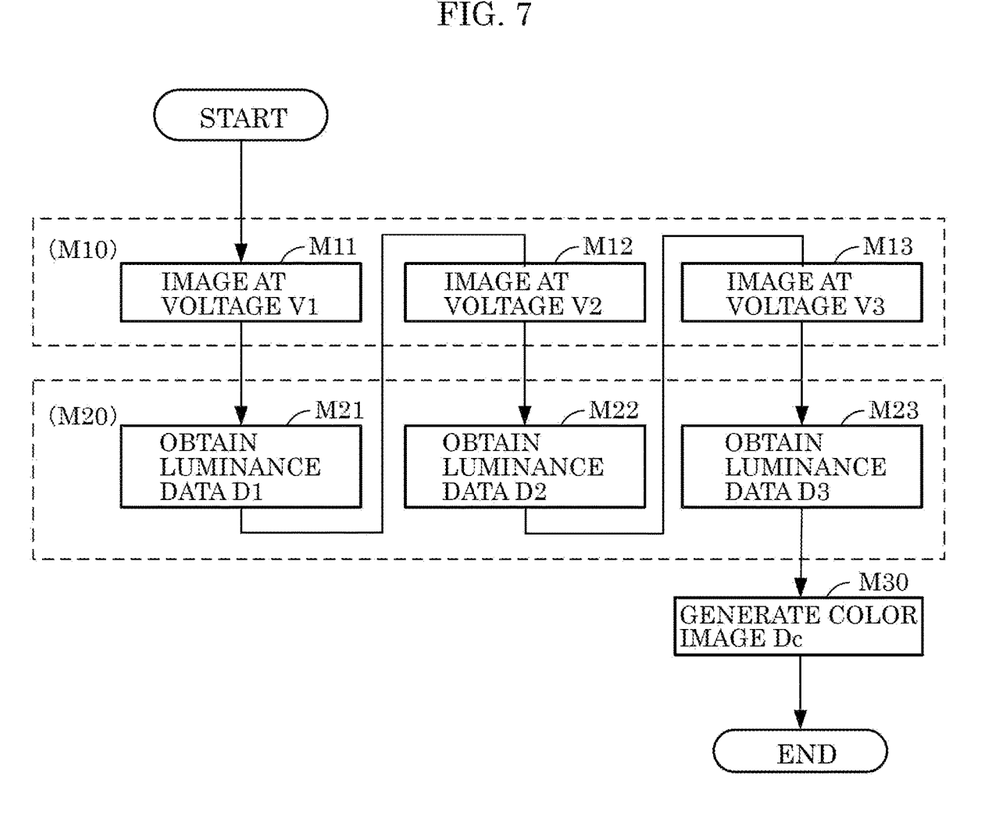
FIG. 7 is a flowchart showing an image generation method in embodiment 1.

FIG. 7 is a flowchart showing the image generation method in embodiment 1.

First, the object Ob1 is imaged while the voltages V1 to V3 are applied to organic photoconductive film 32 (M10). Image generation device 1 obtains the luminance data D1 to D3 resulting from the imaging by image capturer 10 and corresponding to the respective voltages V1 to V3 applied (M20). Details of operations in M10 and M20 are as follows.

First, image capturer 10 images the object Ob1 while voltage V1 is applied to organic photoconductive film 32 (M11). Image capturer 10 converts the potential created by the imaging in FDs 38 into a digital signal and outputs the digital signal. Luminance data obtainer 51 obtains luminance data D1 based on the digital signal output from image capturer 10 (M21). After the data is obtained, the electric charge stored in FDs 38 is released.

Image capturer 10 then images the object Ob1 while voltage V2 (for example, V2>V1) is applied to organic photoconductive film 32 (M12). Image capturer 10 converts the potential created by the imaging in FDs 38 into a digital signal and outputs the digital signal. Luminance data obtainer 51 obtains luminance data D2 based on the digital signal output from image capturer 10 (M22). After the data is obtained, the electric charge stored in FDs 38 is released.

Image capturer 10 then images the object Ob1 while voltage V3 (for example, V3>V2) is applied to organic photoconductive film 32 (M13). Image capturer 10 outputs the potential created by the imaging in FDs 38 into a digital signal and outputs the digital signal. Luminance data obtainer 51 obtains the luminance data D3 based on the digital signal output from image capturer 10 (M23). After the data is obtained, the electric charge stored in FDs 38 is released.

By performing the above operations (M10 and M20), image generation device 1 obtains the three luminance data items D1 to D3.

Color image generator 52 then generates a color image based on the three luminance data items D1 to D3 (M30). Specifically color image generator 52 generates the color image Dc by multiplying the three luminance data items D1 to D3 by a predetermined set of coefficients A1.

Here, a manner of generating the color image Dc from the luminance data D1 to D3 will be described in detail. While the luminance data D1 to D3 and the color image Dc shown in FIG. 6 represent data on all the pixels imaged, the description here will initially focus on one of the pixels for ease of understanding.

For one pixel being focused on, the three luminance data items obtained by the imaging are expressed as luminance data $(i_1, i_2, i_3)$, for example. The color image $(r_1, g_1, b_1)$ generated includes R, G, and B components and is expressed by (Equation 1) below. The set of coefficients A1 is expressed by a transformation matrix of (Equation 2).

[Math. 1]

$$\begin{pmatrix} r_1 \\ g_1 \\ b_1 \end{pmatrix} = \begin{pmatrix} c_{r1} & c_{r2} & c_{r3} \\ c_{g1} & c_{g2} & c_{g3} \\ c_{b1} & c_{b2} & c_{b3} \end{pmatrix} \begin{pmatrix} i_1 \\ i_2 \\ i_3 \end{pmatrix} \quad \text{(Equation 1)}$$

[Math. 2]

$$A1 = \begin{pmatrix} c_{r1} & c_{r2} & c_{r3} \\ c_{g1} & c_{g2} & c_{g3} \\ c_{b1} & c_{b2} & c_{b3} \end{pmatrix} \quad \text{(Equation 2)}$$

$C_{r1}, C_{g1}, C_{b1}$ in the set of coefficients A1 are characteristic values appearing when voltage V1 is applied to organic photoconductive film 32. $C_{r2}, C_{g2}, C_{b2}$ are characteristic values appearing when voltage V2 is applied to organic photoconductive film 32. $C_{r3}, C_{g3}, C_{b3}$ are characteristic values appearing when voltage V3 is applied to organic photoconductive film 32.

Based on the above, a case will be described in which p is the total number pixels (p is an integer greater than 1) and N is the number of different voltages applied to organic photoconductive film 32 (N is an integer greater than 1). Luminance data D1 to DN obtained by the imaging is then expressed as luminance data ($i_{1,1}$ to $i_{p,N}$). The color image ($r_1, g_1, b_1$ to $r_p, g_p, b_p$) generated includes R, G, and B components and is expressed by (Equation 3) below. A set of coefficients A is expressed by a transformation matrix of (Equation 4).

[Math. 3]

$$\begin{pmatrix} r_1 & & r_p \\ g_1 & \cdots & g_p \\ b_1 & & b_p \end{pmatrix} = \begin{pmatrix} c_{r1} & & c_{rN} \\ c_{g1} & \cdots & c_{gN} \\ c_{b1} & & c_{bN} \end{pmatrix} \begin{pmatrix} i_{1,1} & \cdots & i_{p,1} \\ \vdots & & \vdots \\ i_{1,N} & \cdots & i_{p,N} \end{pmatrix} \quad \text{(Equation 3)}$$

[Math. 4]

$$A = \begin{pmatrix} c_{r1} & & c_{rN} \\ c_{g1} & \cdots & c_{gN} \\ c_{b1} & & c_{bN} \end{pmatrix} \quad \text{(Equation 4)}$$

$C_{r1}, C_{g1}, C_{b1}$ in the set of coefficients A are characteristic values appearing when voltage V1 is applied to organic photoconductive film 32. $C_{rN}, C_{gN}, C_{bN}$ are characteristic values appearing when the N-th voltage VN is applied to organic photoconductive film 32.

As above, if imaging is performed while the N voltages V1 to VN are applied to organic photoconductive film 32, the luminance data D1 to DN obtained by the imaging can be multiplied by the above set of coefficients A to generate the color image Dc.

1-3. Manner of Deriving Set of Coefficients Used in Image Generation Method

Figure 8:
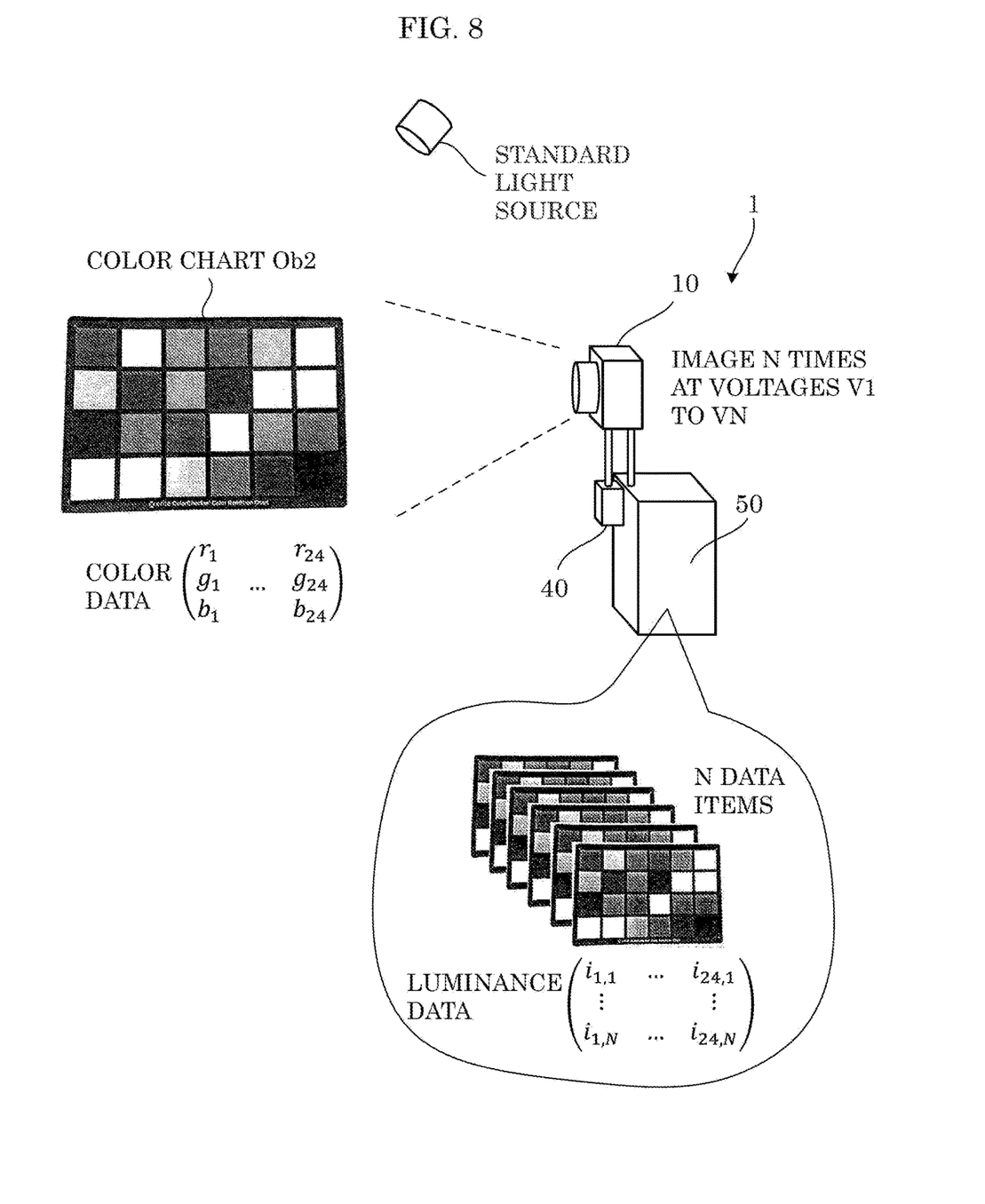
FIG. 8 is a diagram showing an example of the manner of obtaining a set of coefficients used in the image generation method in embodiment 1.

Here, a manner of deriving the set of coefficients A used in the above image generation method will be described.

FIG. 8 is a diagram showing an example of the manner of obtaining the set of coefficients A used in the image generation method. FIG. 8 shows a color chart Ob2 of multiple colors, and a standard light source. The color chart Ob2 used in this embodiment is the Macbeth chart and has 24 colors. The color chart Ob2 is not limited to the Macbeth chart but may be any sample object in which color data corresponding to each color is known.

First, the color chart Ob2 is imaged with image capturer 10. Specifically, N different voltages V1 to VN are applied to organic photoconductive film 32 to image the color chart Ob2 each time the voltages are applied. This yields a determinant as expressed by (Equation 5). The determinant includes color data that consists of a 3×24 matrix, the set of coefficients A that consists of a 3×N matrix, and luminance data that consists of an N×24 matrix. It is to be noted that the determinant of (Equation 5) regards each color as one pixel.

[Math. 5]

$$\begin{pmatrix} r_1 & & r_{24} \\ g_1 & \cdots & g_{24} \\ b_1 & & b_{24} \end{pmatrix} = \begin{pmatrix} c_{r1} & & c_{rN} \\ c_{g1} & \cdots & c_{gN} \\ c_{b1} & & c_{bN} \end{pmatrix} \begin{pmatrix} i_{1,1} & \cdots & i_{24,1} \\ \vdots & & \vdots \\ i_{1,N} & \cdots & i_{24,N} \end{pmatrix} \quad \text{(Equation 5)}$$

[Math. 6]

$$A = \begin{pmatrix} c_{r1} & & c_{rN} \\ c_{g1} & \cdots & c_{gN} \\ c_{b1} & & c_{bN} \end{pmatrix} \quad \text{(Equation 4)}$$

The set of coefficients A expressed by (Equation 4) is derived by solving the determinant of (Equation 5) using a pseudo inverse matrix. Because no solution satisfies all the equations for this determinant, a solution that minimizes the square error over all the equations is adopted.

The manners of deriving the set of coefficients A are not limited to the above but may involve deep learning. For example, the set of coefficients A may be derived by imaging the color chart Ob2 of multiple colors using image capturer 10, and performing learning using, as an input, multiple luminance data items obtained by the imaging, and using, as label data, data corresponding to the multiple colors. In this case, the object to be imaged does not need to be a color chart but may be any sample object in which color data corresponding to each color is known. For example, images of such a sample object captured with a general color camera may be used to assign the luminance values of the R, G, and B components of the color camera to the left side of (Equation 5). Using such an object enables learning of data closely reflecting the actual imaging scene, so that a more closely reproduced color image can be generated.

1-4. Image Generation Result

Now, a result of image generation by image generation device 1 will be described.

Figure 9:
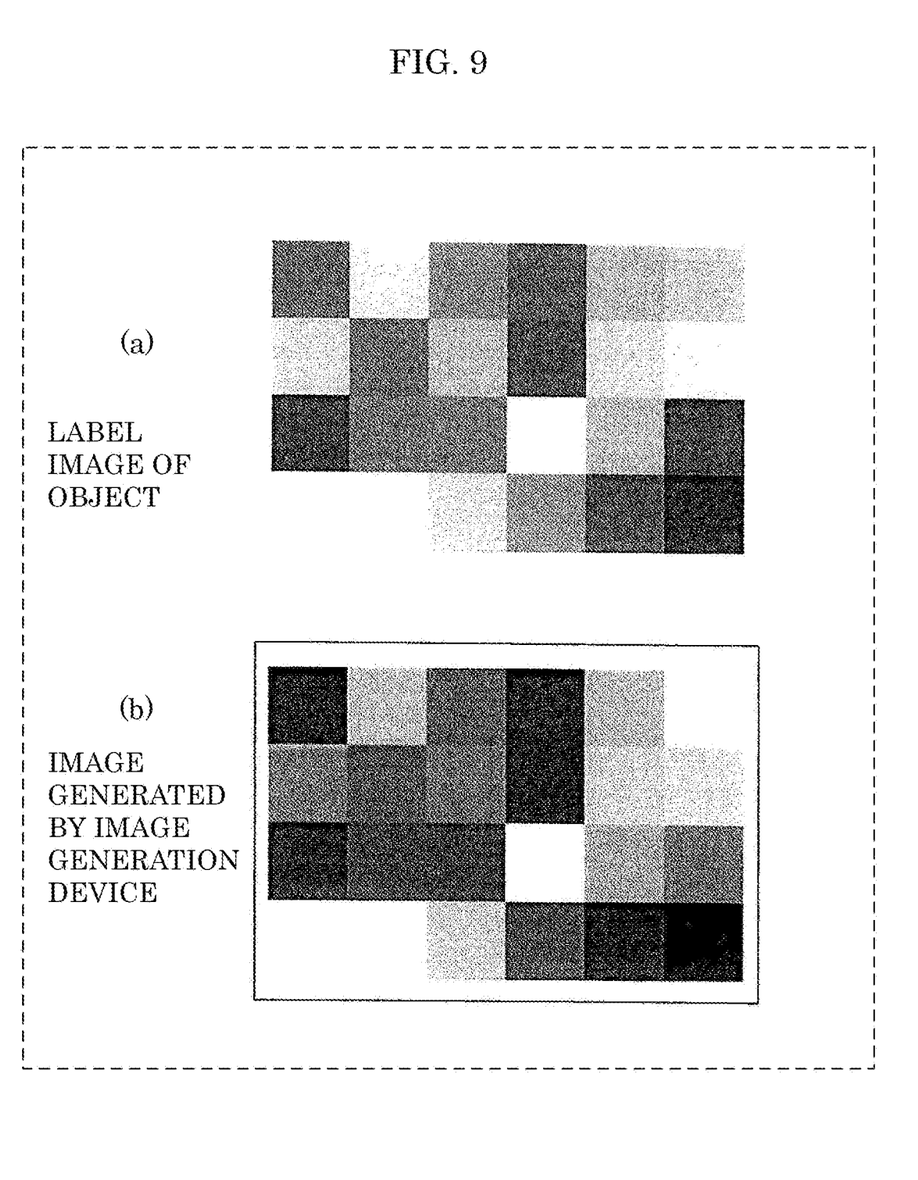
FIG. 9 is a diagram showing an example of an image generated by the image generation device in embodiment 1.

FIG. 9 is a diagram showing an example of an image generated by image generation device 1. In FIG. 9, (a) shows a label image of the object Ob1, while (b) shows an image generated by image generation device 1.

The image shown in (b) in FIG. 9 was obtained by imaging the object Ob1 twice while two voltages of different voltage values were applied to organic photoconductive film 32. It is to be noted that the set of coefficients A, which is a transformation matrix, was obtained by assuming the label image of the object Ob1 to be a two-color image including the (R+G) component; and the B component. Organic photoconductive film 32 used had a two-layer structure including a layer for detecting visible light and a layer for detecting near-infrared light.

As shown, the image generated by image generation device 1 successfully reproduces the colors of the object Ob1.

1-5. Variation 1 of Embodiment 1

Figure 10:
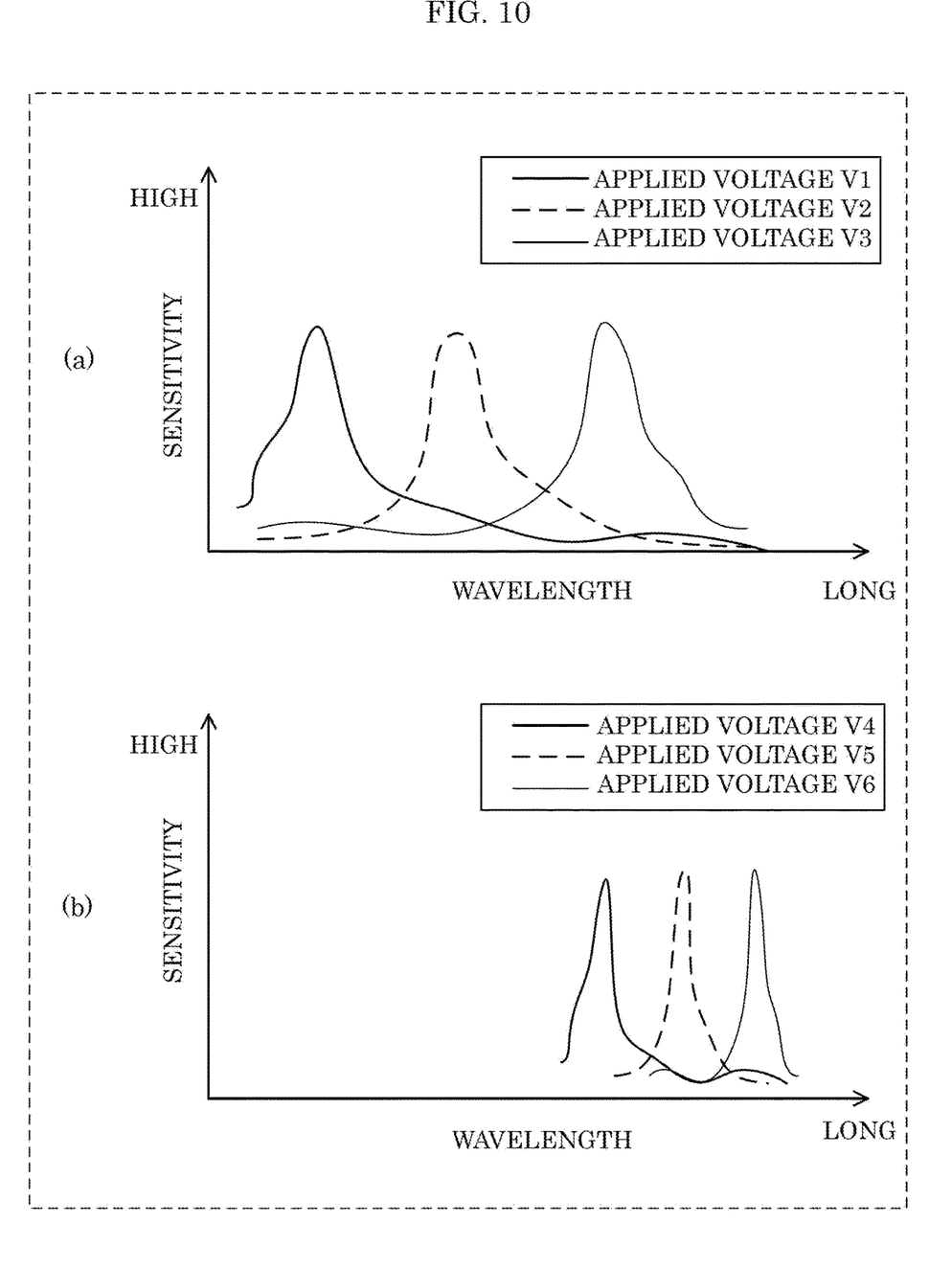
FIG. 10 is a schematic diagram showing wavelength-sensitivity characteristics of an imaging element in the image generation device in variation 1 of embodiment 1.

Now, image generation device 1 in variation 1 of embodiment 1 will be described. In an example to be described in variation 1, the values of the voltages applied to organic photoconductive film 32 are changed according to the scene in which the imaging is performed.

FIG. 10 is a schematic diagram showing wavelength-sensitivity characteristics of imaging element 80 in image generation device 1.

(a) in FIG. 10 shows sensitivity characteristics in imaging in a light environment. In the example shown, imaging is performed using a wide wavelength range corresponding to the visible light range while voltages V1, V2, and V3 are applied to organic photoconductive film 32. (b) in FIG. 10 shows sensitivity characteristics in imaging in an environment darker than the environment of (a). In the example shown, imaging is performed using a wavelength range close to the near-infrared range while voltages V4, V5, and V6 are applied to organic photoconductive film 32. These different voltages V1 to V6 are applied by voltage generator 40 to organic photoconductive film 32.

The set of voltages may be switched as preset in image generation device 1 between the voltages V1 to V3 and the voltages V4 to V6 for light times and dark times, respectively. Alternatively, the voltages V1 to V3 may initially be used for imaging, and if the imaging yields a dark color image Dc, the voltages V4 to V6 may then be used for imaging. That is, voltage generator 40 has information on multiple sets of voltage values and switches among the sets of voltage values. Exemplary sets of voltage values may be a first voltage value set (V1 to V3), and a second voltage value set (V4 to V6) for use in an imaging environment darker than the imaging environment for the first set.

Image generation device 1 may further include a sensor. The voltage value set may be selected based on information about correspondences between sensor values and voltage values, and on a sensor value obtained by the sensor. The voltage value set may also be selected by obtaining a sensor value provided by a sensor external to image generation device 1. The voltage value set may also be switched in response to a user's input to image generation device 1.

Conditions for changing the values of the voltages applied to organic photoconductive film 32 for imaging are not limited to the lightness of the environment. For example, if human skin is to be imaged, the voltages applied to organic photoconductive film 32 may be set such that a wavelength range close to the skin color can be used for the imaging.

Thus, as in image generation device 1 in variation imaging for various purposes can be performed by changing the voltages applied to organic photoconductive film 32 according to the scene in which imaging is performed.

1-6. Variation 2 of Embodiment 1

Figure 11:
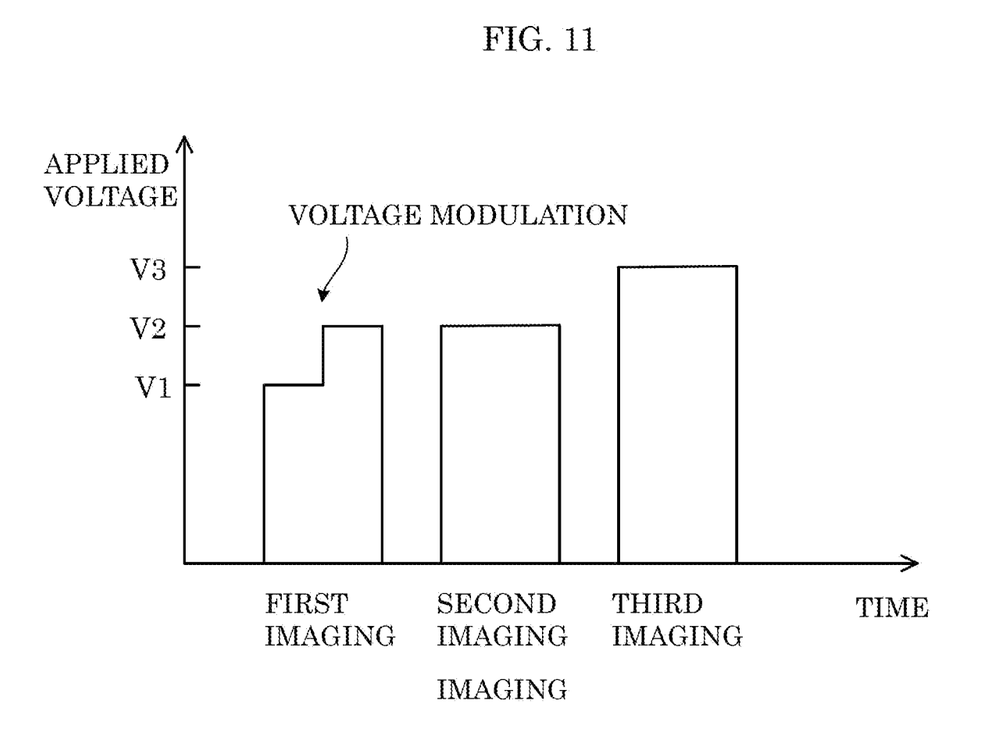
FIG. 11 is a diagram showing voltages applied to an organic photoconductive film during exposure performed by the image capturer in the image generation device in variation 2 of embodiment 1.

Now, image generation device 1 in variation 2 of embodiment 1 will be described. In an example to be described in variation 2, a voltage applied to organic photoconductive film 32 is modulated during exposure (within an exposure period) performed by image capturer 10.

FIG. 11 is a diagram showing voltages applied to organic photoconductive film 32 during exposure performed by image capturer 10 in image generation device 1. In the example shown in FIG. 11, image capturer 10 changes an applied voltage during exposure, that is, while FDs 38 are storing electric charge.

As shown, imaging is performed by making three exposures. The first imaging is performed while voltage V1 and then voltage V2 are applied to organic photoconductive film 32. Subsequently, the second imaging is performed while voltage V2 is applied to organic photoconductive film 32, and the third imaging is performed while voltage V3 is applied.

In this manner, the voltage is modulated during the first exposure. For example, this can create a characteristic having both the sensitivity corresponding to the application of voltage V1 and the sensitivity corresponding to the application of voltage V2. According to image generation device 1 in variation 2, sensitivity characteristics for a specific purpose can be created and used to obtain the luminance data D1 to D3 and generate the color image Dc.

Embodiment 2

Figure 12:
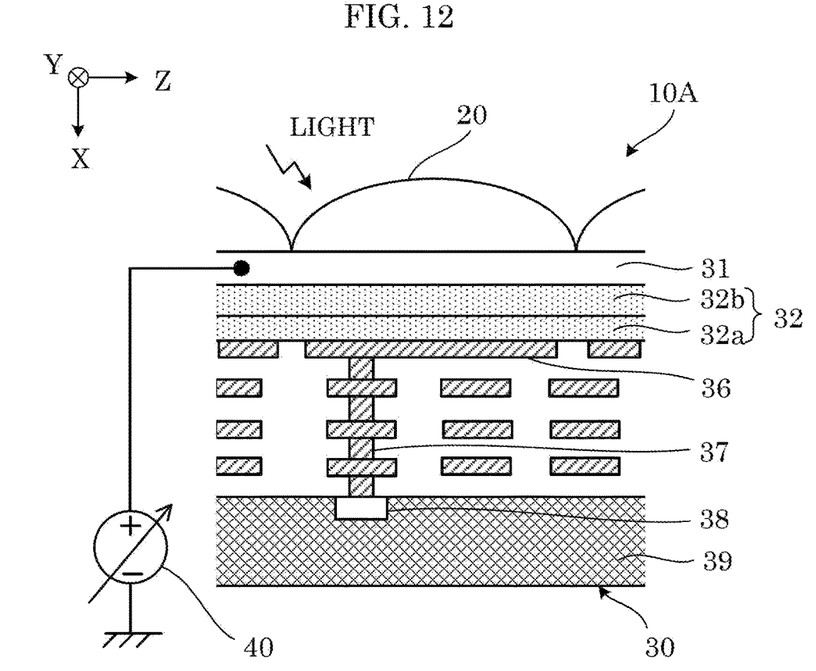
FIG. 12 is a schematic diagram showing an image capturer and the voltage generator in the image generation device in embodiment 2.

Configurations of image generation device 1 in embodiment 2 will be described.

FIG. 12 is a schematic diagram showing image capturer 10A and voltage generator 40 in image generation device 1 in embodiment 2.

Image captures 10A includes: microlenses 20; and imaging element 30 having pixels arranged in an array.

Imaging element 30 includes: silicon substrate 39; FDs 38 provided on silicon substrate 39; metal wires 37 and pixel electrodes 36 electrically connected to FDs 38; organic photoconductive film 32 provided on pixel electrodes 36; and transparent electrode 31 provided on organic photoconductive film 32.

Organic photoconductive film 32 in this embodiment has a stacked structure including first organic photoconductive film 32a for detecting near-infrared light and second organic photoconductive film 32b for detecting visible light.

In this embodiment, second organic photoconductive film 32b is formed on first organic photoconductive film 32a. That is, second organic photoconductive film 32b for detecting visible light (RGB) is provided closer to the object Ob1 than first organic photoconductive film 32a for detecting near-infrared light (NIR) is. According to this structure, first organic photoconductive film 32a can detect near-infrared light after second organic photoconductive film 32b detects and eliminates visible light. This can improve near-infrared light detection performance.

In embodiment 2, the number of voltages applied to organic photoconductive films 32a and 32b is greater than or equal to the number of organic photoconductive films 32a and 32b. For example, in embodiment 2, three voltages V1 to V3 are applied to each of two organic photoconductive films 32a and 32b. Consequently, more sensitivity characteristics can be created than in the case in which organic photoconductive film 32 is single-layered. This enables a closely reproduced color image Dc to be generated using further accurate sensitivity characteristics.

Embodiment 3

Figure 13:
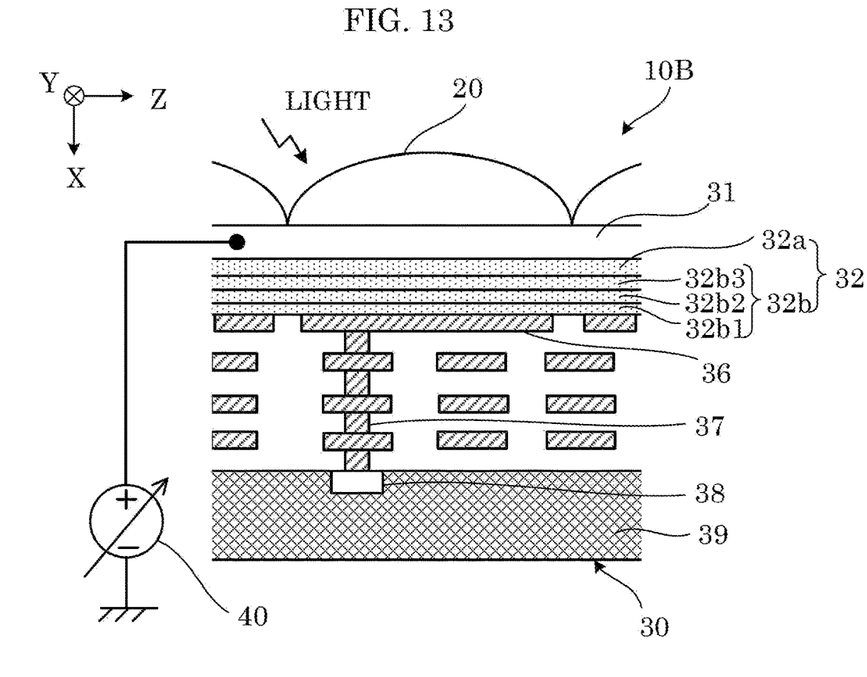
FIG. 13 is a schematic diagram showing an image capturer and the voltage generator in the image generation device in embodiment 3.

Configurations of image generation device 1 in embodiment 3 will be described.

FIG. 13 is a schematic diagram showing image capturer 10B and voltage generator 40 in image generation device 1 in embodiment 3.

Image capturer 10B includes: microlenses 20; and imaging element 30 having pixels arranged in an array.

Imaging element 30 includes: silicon substrate 39; FDs 38 provided on silicon substrate 39; metal wires 37 and pixel electrodes 36 electrically connected to FDs 38; organic photoconductive film 32 provided on pixel electrodes 36; and transparent electrode 31 provided on organic photoconductive film 32.

Organic photoconductive film 32 in this embodiment has a stacked structure including first organic photoconductive film 32a for detecting near-infrared light (NIR) and second organic photoconductive film 32b for detecting visible light (RGB). Second organic photoconductive film 32b has a three-layer structure in which R layer 32b1, G layer 32b2, and B layer 32b3 are stacked in this order on pixel electrodes 36. For example, R layer 32b1 detects the R component of light, G layer 32b2 detects the G component of light, and B layer 32b3 detects the B component of light.

In this embodiment, first organic photoconductive film 32a is formed on second organic photoconductive film 32b. That is, first organic photoconductive film 32a for detecting near-infrared light is provided closer to the object Ob1 than second organic photoconductive film 32b for detecting visible light is. According to this structure, second organic photoconductive film 32b can detect visible light after first organic photoconductive film 32a detects and eliminates near-infrared light. This can improve color reproducibility for visible light.

Other Embodiments

Thus, the embodiments have been described above as examples of techniques according to the present disclosure. The techniques according to the present disclosure, however, are applicable not only to the above embodiments but to embodiments subjected to appropriate modification, replacement, addition, and elimination. That is, without departing from the spirit of the present disclosure, aspects of the techniques according to the present disclosure include variations of the above embodiments, and combinations of elements of different embodiments, as occurring to those skilled in the art.

The components of the image generation device illustrated in the above embodiments (in particular, circuits including data processor 50) may be implemented in dedicated hardware or may be implemented by executing software (a program) appropriate for the components. The components may also be implemented by a program executor such as a microprocessor reading and executing a program recorded on a storage medium (or a recording medium), such as a hard disk or semiconductor memory.

The circuits in the image generation device may be integrated into a single circuit or may be separate circuits. These circuits may each be a general-purpose circuit or a special-purpose circuit. Processes performed by a certain component in the above embodiments may alternatively be performed by another component, for example. The order of performing processes in the above embodiments may be changed, or multiple processes may be performed in parallel.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly an such modifications are intended to be included within the scope of the present disclosure.

INDUSTRIAL APPLICABILITY

The image generation device according to the present disclosure is applicable as a device that generates color images using an imaging device having no color filter.

What is claimed is:

1. An image generation device, comprising:
a voltage generator that generates a plurality of voltages each having a different voltage value;
an image capturer that includes an organic photoconductive film and a transparent electrode that is light-transmissive, and performs imaging every time each of the plurality of voltages is applied;
a luminance data obtainer that obtains a plurality of luminance data items corresponding to the plurality of voltages applied, each of the plurality of luminance data items being obtained from the imaging performed by the image capturer; and
a color image generator that generates a color image based on the plurality of luminance data items,
wherein the organic photoconductive film photoelectrically converts light entering through the transparent electrode and not through a color filter, and
the color image generator generates the color image by multiplying the plurality of luminance data items by a set of coefficients that is predetermined.

2. The image generation device according to claim 1, wherein
the color image generator generates the color image by multiplying the plurality of luminance data items by a set of coefficients that is predetermined.

3. The image generation device according to claim 2, wherein
the set of coefficients is derived by: imaging a color chart having a plurality of colors using the image capturer to obtain a determinant including color data corresponding to the plurality of colors, the set of coefficients, and the plurality of luminance data items; and solving the determinant using a pseudo inverse matrix.

4. The image generation device according to claim 2, wherein
the set of coefficients is derived by: imaging a color chart having a plurality of colors using the image capturer; and performing learning using, as input data, the plurality of luminance data items obtained from the imaging of the color chart, and as label data, color data corresponding to the plurality of colors.

5. The image generation device according to claim 1, wherein
the voltage generator changes at least one of the plurality of voltages in accordance with a scene in which the imaging is performed by the image capturer.

6. The image generation device according to claim 5, wherein
the voltage generator modulates at least one of the plurality of voltages during exposure by the image capturer.

7. The image generation device according to claim 1, wherein
the image capturer includes a plurality of organic photoconductive films that are stacked, each of the plurality of organic photoconductive films being the organic photoconductive film, and
a total number of the plurality of voltages to be applied to the plurality of organic photoconductive films is greater than or equal to a total number of the plurality of organic photoconductive films.

8. The image generation device according to claim 7, wherein
the image capturer includes, as the plurality of organic photoconductive films, a first organic photoconductive film for detecting visible light and a second organic photoconductive film for detecting near-infrared light, and
the first organic photoconductive film is disposed closer to an object than the second organic photoconductive film is.

9. The image generation device according to claim 7, wherein
the image capturer includes, as the plurality of organic photoconductive films, a first organic photoconductive film for detecting visible light and a second organic photoconductive film for detecting near-infrared light, and
the second organic photoconductive film is disposed closer to an object than the first organic photoconductive film is.

10. An image generation method, comprising:
performing imaging by applying, to an organic photoconductive film and a transparent electrode that is light-transmissive, a plurality of voltages each having a different voltage value;
obtaining a plurality of luminance data items corresponding to the plurality of voltages applied, the plurality of luminance data items being obtained from the imaging; and
generating a color image based on the plurality of luminance data items,
wherein the organic photoconductive film photoelectrically converts light entering through the transparent electrode and not through a color filter, and
the color image is generated by multiplying the plurality of luminance data items by a set of coefficients that is predetermined.

11. An image generation device, comprising:
a voltage generator that generates a plurality of voltages each having a different voltage value;
an image capturer that includes an organic photoconductive film, and performs imaging every time each of the plurality of voltages is applied;
a luminance data obtainer that obtains a plurality of luminance data items corresponding to the plurality of voltages applied, each of the plurality of luminance data items being obtained from the imaging performed by the image capturer; and
a color image generator that generates a color image based on the plurality of luminance data items,
wherein the image capturer has a uniform wavelength-transmittance characteristic of light that enters the organic photoconductive film from an object.

* * * * *